United States Patent
Kim et al.

(10) Patent No.: US 9,407,286 B2
(45) Date of Patent: Aug. 2, 2016

(54) DATA COMPRESSION APPARATUS, DATA COMPRESSION METHOD, AND MEMORY SYSTEM INCLUDING THE DATA COMPRESSION APPARATUS

(71) Applicant: SAMSUNG ELECTRONICS CO., LTD., Suwon-Si, Gyeonggi-Do (KR)

(72) Inventors: Tae-Hwan Kim, Suwon-si (KR); Jun-Jin Kong, Yongin-si (KR); Dae-Wook Kim, Osan-si (KR); Man-Keun Seo, Hwaseong-si (KR); Hong-Rak Son, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 259 days.

(21) Appl. No.: 14/017,525

(22) Filed: Sep. 4, 2013

(65) Prior Publication Data
US 2014/0108362 A1    Apr. 17, 2014

(30) Foreign Application Priority Data

Oct. 15, 2012    (KR) .................. 10-2012-0114265

(51) Int. Cl.
*G06F 17/30* (2006.01)
*H03M 7/30* (2006.01)

(52) U.S. Cl.
CPC .................................. *H03M 7/3084* (2013.01)

(58) Field of Classification Search
USPC .......... 707/307, 609, 687, 705, 791, 813, 821
See application file for complete search history.

(56) References Cited

U.S. PATENT DOCUMENTS

| | | | |
|---|---|---|---|
| 5,371,499 A | 12/1994 | Graybill et al. | |
| 6,842,832 B1 | 1/2005 | Franaszek et al. | |
| 7,844,581 B2 | 11/2010 | Dubnicki et al. | |
| 8,085,171 B2 | 12/2011 | Paris | |
| 2006/0066902 A1* | 3/2006 | Matsui | G06F 21/6209 358/1.16 |
| 2009/0161547 A1* | 6/2009 | Riddle | G06F 9/526 370/236 |
| 2011/0066628 A1 | 3/2011 | Jayaraman | |
| 2011/0238914 A1 | 9/2011 | Hirayama | |
| 2012/0268471 A1* | 10/2012 | Khalvati | G06T 1/60 345/522 |
| 2012/0297167 A1* | 11/2012 | Shah | G06F 9/30101 712/202 |

FOREIGN PATENT DOCUMENTS

| | | |
|---|---|---|
| JP | 06242923 | 9/1994 |
| JP | 2000090115 | 3/2000 |
| JP | 2009246816 | 10/2009 |

* cited by examiner

*Primary Examiner* — Sana Al Hashemi
(74) *Attorney, Agent, or Firm* — Volentine & Whitt, PLLC

(57) ABSTRACT

Provided are data compression method, data compression apparatus, and memory system. The data compression method includes receiving input data and generating a hash key for the input data, searching a hash table with the generated hash key, and if it is determined that the input data is a hash hit, compressing the input data using the hash table; and searching a cache memory with the input data, and if it is determined that the input data is a cache hit, compressing the input data using the cache memory.

26 Claims, 16 Drawing Sheets

F hash (A0, A1, A2, A3) = Ka

F hash (B0, B1, B2, B3) = Kb

F hash (C0, C1, C2, C3) = Kc

FIG. 3
30

| HASH KEY | COLLISION COUNTER | INDEX |
|---|---|---|
| Ka | 2 | 8 |
| Kb | 4 | 16 |
| Kc | 1 | 32 |
|  |  |  |
|  |  |  |
|  |  |  |
| ⋮ | ⋮ | ⋮ |

FIG. 5
50

| REFERENCING COUNTER | DATA | INDEX |
|---|---|---|
| 2 | B0, B1, B2, B3 | 16 |
|  |  |  |
|  |  |  |
| ⋮ | ⋮ | ⋮ |

FIG. 7

F hash (D0, D1, D2, D3) = Ka

FIG. 8
50

| REFERENCING COUNTER | DATA | INDEX |
|---|---|---|
| 2 | B0, B1, B2, B3 | 16 |
| 1 | A0, A1, A2, A3 | 8 |
| 1 | D0, D1, D2, D3 | 48 |
| ⋮ | ⋮ | ⋮ |

| HASH KEY | COLLISION COUNTER | INDEX |
|---|---|---|
| Ka | ~~2~~ 3 | ~~8~~ 48 |
| Kb | 4 | 16 |
| Kc | 1 | 32 |
| | | |
| | | |
| | | |
| ⋮ | ⋮ | ⋮ |

| REFERENCING COUNTER | DATA | INDEX |
|---|---|---|
| 2 | B0, B1, B2, B3 | 16 |
| ~~1~~ 2 | A0, A1, A2, A3 | 8 |
| 1 | D0, D1, D2, D3 | 48 |
| ⋮ | ⋮ | ⋮ |

FIG. 11
30

| HASH KEY | COLLISION COUNTER | INDEX |
|----------|-------------------|-------|
| Ka | ~~3~~ 4 | ~~48~~ 64 |
| Kb | 4 | 16 |
| Kc | 1 | 32 |
|  |  |  |
|  |  |  |
|  |  |  |
| ⋮ | ⋮ | ⋮ |

DATA COMPRESSION APPARATUS, DATA COMPRESSION METHOD, AND MEMORY SYSTEM INCLUDING THE DATA COMPRESSION APPARATUS

CROSS-REFERENCE TO RELATED APPLICATIONS

This application claims priority from Korean Patent Application No. 10-2012-0114265 filed on Oct. 15, 2012, the subject matter of which is hereby incorporated by reference.

BACKGROUND

The inventive concept relates to data compression apparatus(es), data compression methods, and memory systems including a data compression apparatus.

A data compression technology has been used in various ways to reduce the amount of energy required to communicate data to/from a data storage device, to increase data transmission speed, and to improve utilization of limited data storage space. That is, if the size of data being written to and/or read from a data storage device can be reduced using data compression technology, the overall number of read/write operations that must be performed by the data storage device may be markedly decreased. And for certain data storage devices, a reduced number of read/write operations will result in an extended operating lifetime.

SUMMARY

According to an aspect of the inventive concept, there is provided a data compression method comprising; receiving input data and generating a hash key for the input data, searching a hash table with the hash key, and upon determining that the input data is a hash hit, compressing the input data using the hash table, else searching a cache memory using the input data, and upon determining that the input data is a cache hit, compressing the input data using the cache memory.

According to another aspect of the inventive concept, there is provided a data compression method comprising; determining whether first input data is a hash hit by searching a hash table using a hash key generated for the first input data, and determining whether second input data, different from the first input data, is a cache hit by searching a cache memory using the second input data, wherein determining whether the first input data is the hash hit and determining whether the second input data is the cache hit are simultaneously performed during a first system clock cycle.

According to another aspect of the inventive concept, there is provided a data compression apparatus comprising; a hash key generator configured to receive input data and provide a corresponding hash key, a control unit configured to determine whether the input data is a hash hit by searching a hash table using the hash key or after determining that the input data is not a hash hit to determine whether the input data is a cache hit by searching a cache memory using the input data, and to provide compressing information corresponding to the input data, and an encoder configured to encode the input data based on the compressing information and provide output data obtained by compressing the input data.

According to another aspect of the inventive concept, there is provided a memory system comprising; a controller configured to receive input data from a host and provide output data obtained by compressing the input data, and a nonvolatile memory device that stores the output data, wherein the controller includes a data compression apparatus including; a hash table used to generate the output data, and a cache memory, and the data compression apparatus is configured to search the hash table using a hash key generated for the input data, and upon determining that the input data is a hash hit, the data compression apparatus is further configured to generate the output data using the hash table, else to search the cache memory using the input data and upon determining that the input data is a cache hit to generate the output data using the cache memory.

BRIEF DESCRIPTION OF THE DRAWINGS

FIG. 3 is a diagram illustrating one possible configuration for the hash table 30 of FIG. 1;

FIG. 5 is a diagram illustrating one possible configuration for the cache memory 50 of FIG. 1;

FIGS. 7, 8, 9, 10, and 11 are respective diagrams further illustrating the data compression method of FIG. 6 in some additional detail;

DETAILED DESCRIPTION

Embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete and will fully convey the concept of the inventive concept to those skilled in the art. The scope of the inventive concept is defined by the following claims and their equivalents. Throughout the written description and drawings like reference numbers and labels are used to denote like or similar elements, components and/or steps.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

Unless defined otherwise, all technical and scientific terms used herein have the same meaning as commonly understood by one of ordinary skill in the art to which this inventive concept belongs. Further, unless defined otherwise, all terms defined in generally used dictionaries may not be overly interpreted.

Figures 1, 2:
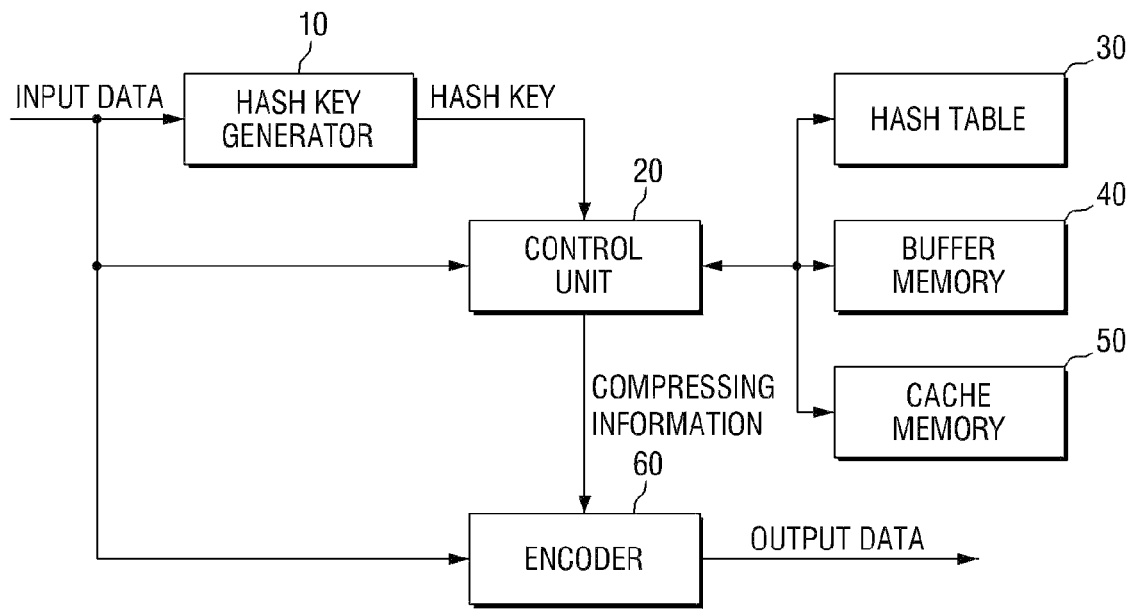
FIG. 1 is a block diagram of a data compression apparatus according to certain embodiments of the inventive concept.
FIG. 2 is a diagram illustrating one approach to the operation of the hash key generator 10 of FIG. 1.
Figure 4:
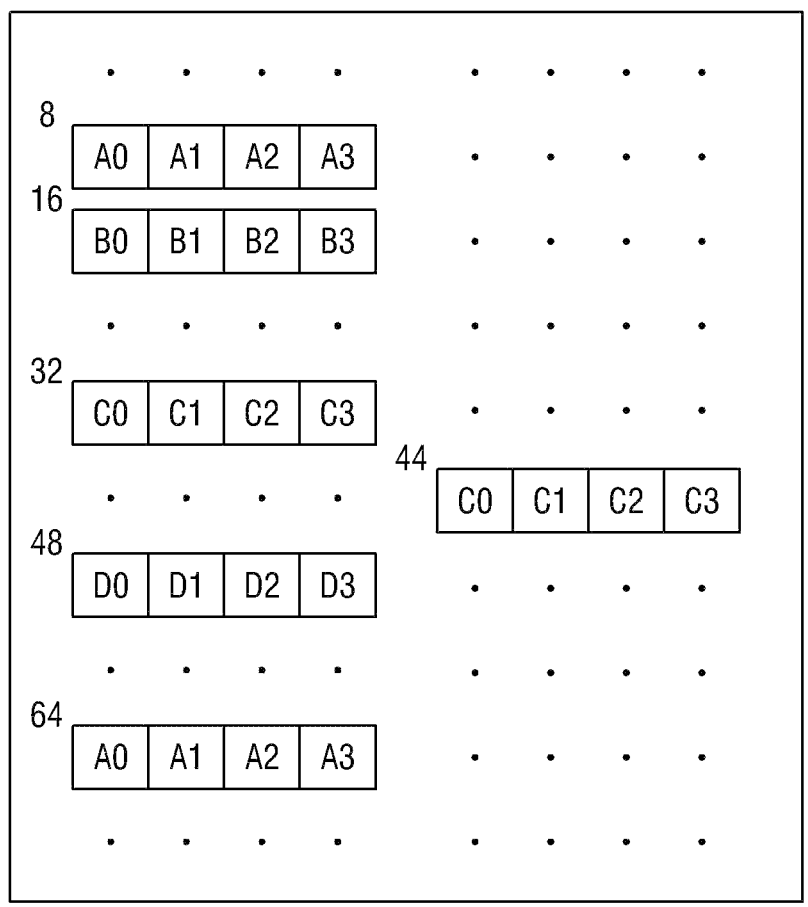
FIG. 4 is a diagram illustrating one possible configuration for the buffer memory 40 of FIG. 1.

FIG. 1 is a block diagram illustrating a data compression apparatus according to certain embodiments of the inventive concept. In the exemplary context provided by FIG. 1, FIG. 2 illustrates one possible approach to the operation of the hash key generator 10; FIG. 3 illustrates one possible configuration for the hash table 30; FIG. 4 illustrates one possible configuration for the buffer memory 40; and FIG. 5 illustrates one possible configuration for the cache memory 50.

Referring to FIG. 1, a data compression apparatus 1 comprises a hash key generator 10, a control unit 20, a hash table 30, a cache memory 50, and an encoder 60.

The hash key generator 10 generally operates by receiving input data and providing a corresponding hash key for the input data. For example, as shown in FIG. 2, it is assumed that upon receiving first input data (A0, A1, A2, A3) the hash key generator 10 generates a first hash key "Ka", upon receiving second input data (B0, B1, B2, B3) the key generator 10 generates a second hash key "Kb", and upon receiving third input data (C0, C1, C2, C3) the hash key generator 10 generates a third has key "Kc".

In certain embodiments of the inventive concept, an XOR operation may be used as a hash function (F hash) performed by the key generator 10 on input data. That is, the hash key generator 10 may shift received input data by n bits, where "n" is a natural number, and then perform an XOR operation with respect to the shifted input data in order to generate a corresponding hash key.

For example, assuming the first case illustrated in FIG. 2, the hash key generator 10 upon receiving the first input data (A0, A1, A2, A3) shift data A0 by zero bits, shift A1 by one bit, shift A2 by two bits, and shift A3 by three bits. Then, the hash key generator 10 may generate the first hash key, Ka, by performing an XOR operation with respect to the shifted first input data. Those skilled in the art will, however, recognize that use of an XOR operation on shifted input data is merely one example of many different hash functions that may be used by a hash key generator in embodiments of the inventive concept to generate a hash key.

The control unit 20 may be used to generate "compressing information" in response to input data and its corresponding hash key, as provided by the hash key generator 10. The compressing information may then be provide to the encoder 60.

In the context of control unit 20, the term "unit" should be broadly interrupted to read on various software, firmware and/or hardware component(s) (e.g., a Field Programmable Gate Array, Application Specific Integrated Circuit, etc.) that may be operatively configured to perform the data transfer, data computation and data storage functions generally understood by those skilled in the art. The control unit 20 may advantageously be configured to operate in conjunction with addressable storage media, and may be implemented using one or more processors. The control unit 20 may include or be operated in conjunction with certain software components such as object-oriented software components, class components and task components, processes, functions, attributes, procedures, subroutines, segments of program code, drivers, firmware, microcode, circuitry, data, databases, data structures, tables, arrays, and variables.

In certain embodiments of the inventive concept, the control unit 20 may be used to determine whether the input data results in a so-called "hash hit" by searching the hash table 30 and buffer memory 40 based using the hash key corresponding to the input data. The control unit 20 may also be used to determine whether the input data results in a so-called "cache hit" by searching the cache memory 50 using the input data. After making one or both of these determinations, the control unit 20 will generate compressing information associated with the input data, and provide the compressing information to the encoder 60.

Referring now to FIG. 3, the hash table 30 is assumed to include a hash key field, a collision counter field, and an index field. Here, the hash key field is used when the hash key generator 10 searches the hash table using the hash key generated by the hash key generator 10 as a key value. The collision counter field may be used to record a number of hash collisions occurring due to use of the corresponding hash key. The index field may be used to store index values (or "indexes") pointing to data locations in the buffer memory 40.

In certain embodiments of the inventive concept, the hash table 30 may be implemented using SRAM (Static Random Access Memory).

Referring to FIG. 4, the input data provided from the host is temporarily store in the buffer memory 40. In certain embodiments of the inventive concept, the buffer memory 40 may also be implemented using SRAM.

In the data compression apparatus illustrated in FIG. 1, the buffer memory 40 is shown as an integral component. However, this need not always be the case. For example, in certain embodiments of the inventive concept, the buffer memory 40 may be separately provided by a data storage device external to the data compression apparatus (See, e.g., the RAM 1240 and data compression apparatus 1230 of FIG. 16).

The particular location of input data stored in the buffer memory 40 may be indicated using a predetermined index. For example as shown in FIG. 4, first data (A0, A1, A2, A3) is indexed by a value of '8', second data (B0, B1, B2, B3) is indexed by a value of '16', and third data (C0, C1, C2, C3) is indexed by a value of '32'. Respective indexes may be stored in the hash table 30 (e.g., FIG. 3) using the index field. Thus, each hash key stored in the hash table 30 may be stored in "association with" a corresponding index and a collision counter value.

Referring now to FIG. 5, the cache memory 50 is assumed to include a reference counter field, a data field, and an index field. Here, the reference counter field may be used to store a value indicating a count of how many times the corresponding input data is referred to. The data field stores corresponding input data, and the index field stores the corresponding index.

In the context of the hash table 30 and cache memory 50, each table "entry" may be said to have multiple associated fields, as described above for example.

In certain embodiments of the inventive concept, the cache memory 50 may be implemented using a plurality of flip-flops. That is, in certain embodiments of the inventive concept, the cache memory 50 may be implemented as a register file including a plurality of flip-flops.

As will be described in some additional detail hereafter, the control unit 20 is able to reference entries in the hash table 30 and cache memory 50 within the compression apparatus 1 of FIG. 1 in order to generate compressing information corresponding to respective input data.

Referring back to FIG. 1, the encoder 60 receives the compressing information from the control unit 20 and provides compressed input data as "output data". The output data may subsequently be stored in a data storage device (e.g., non-volatile memory) and/or provided to external circuitry.

One or more conventionally understood data compression algorithm(s) may be used to generate output data from input data within embodiments of the inventive concept. For example, in certain embodiments of the inventive concept, output data may be obtained by identifying input data by only its position and length information (e.g., a LZ-series algorithm, such as LZ (Lempel-Ziv)77, LZ78, or LZW (Lempel-Ziv-Welch)). In other embodiments of the inventive concept, a deflate algorithm, a Huffman algorithm, or an arithmetic coding algorithm may be used to compress the input data to generate corresponding output data.

Hereinafter, referring to FIGS. 6 to 11, a data compression method according to an embodiment of the present inventive concept will be described.

Figure 6:
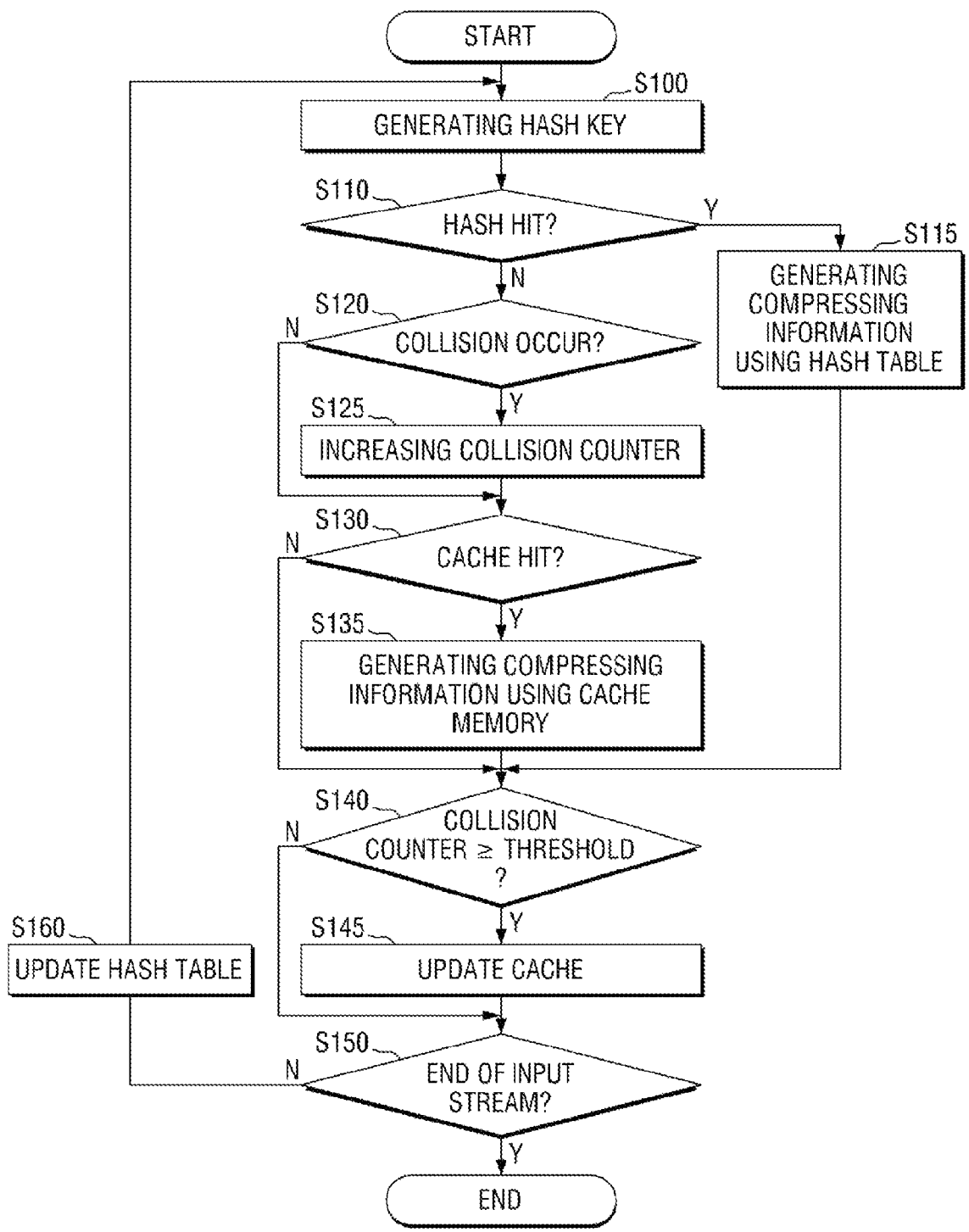
FIG. 6 is a flowchart summarizing a data compression method according to certain embodiments of the inventive concept.

FIG. 6 is a flowchart summarizing a data compression method according to certain embodiments of the inventive concept. FIGS. 7, 8, 9, 10 and 11 further illustrate some details related to the method of FIG. 6.

For convenience of description, the hash table of FIG. 3, the buffer memory 40 of FIG. 4, and the cache memory 50 of FIG. 5 are assumed, along with the data compression apparatus of FIG. 1.

The method of FIG. 6 begins with generation of a hash key from the input data (S100). Next, a determination is made as to whether or not the input data results in a hash hit based on the hash key (S110). If the input data is 'hash hot' (i.e., results in a hash hit or S110=Y), compressing information corresponding to the input data may be readily generated using the hash table (S115).

More specifically, referring to FIG. 1, the control unit 20 may extract an index for the input data and associated with (or "linked to") a hash key by searching the hash table 30 using the hash key generated by the has key generator 10. Then, the control unit 20 extracts "indication data" identified by the index referenced from the hash table 30 among the data stored in the buffer memory 40. Here, if the input data associated with the hash key is equal to the extracted indication data, a hash hit has occurred. Accordingly, the control unit 20 generates compressing information for compressing the input data using the index referenced from the hash table 30 in conjunction with length information for the indication/input data.

For example, it is assumed that third data (C0, C1, C2, C3) as indexed by a value '44' in the buffer memory 40 is received as input data to the data compression apparatus 1 of FIG. 1, and accordingly the hash key generator 10 generate the third hash key, Kc.

If the control unit 20 then searches the hash table 30 using the third hash key Kc, it will find a third index '32'. Using this index, the control unit 20 may extract indication data identified by the third index '32' from the data stored in the buffer memory 40. In this manner, the previously stored third data (C0, C1, C2, C3) may be identified as indication data stored in the buffer memory 40.

In such a case, since the input data and the identified indication data are equal, the input data is a hash hit. Accordingly, the control unit 20 may generate compressing information for compressing the input data using the corresponding index and length information for the indication data (e.g., 4 bytes as assumed in the working example). Thus, if compression of the input data may be accomplished using the hash table 30, there is no need to determine whether compression has been accomplished using the cache memory 50, and this method step may be omitted.

However, if the input data is not the hash hit (S110=N), the control unit 20 determines whether a hash collision has occurred (S120). Then, if a hash collision has occurred (S120=Y), the collision counter of the hash table is increased. (S125). Here, the term "hash collision" means that received input data is different from indication data extracted from the buffer memory 40. That is, if the input data and the indication data have different data values, but the same hash keys, as generated by a given hash function (F hash), a hash collision is said occur.

For example, it is now assumed that fourth input data (D0, D1, D2, D3) has been previously stored in the buffer memory 40 and has an index of '48'. However, upon again receiving the fourth input data in the data compression apparatus 1, it is further assumed that the hash key generated for the fourth input data (D0, D1, D2, D3) by the key generator 10 is 'Ka'. Under these conditions, the control unit 20 will search the hash table 30 using the hash key 'Ka' and will return an index of '8'. Yet, using this index, the control unit 20 will extract corresponding indication data (i.e., A0, A1, A2, A3) stored in the buffer memory 40. Accordingly, in this case, since the identified data (D0, D1, D2, D3) and indication data (A0, A1, A2, A3) are not equal, the fourth input data is not a hash hit but is instead a hash collision.

In contrast, if a hash key generated from the fourth input data (D0, D1, D2, D3) is assumed to be 'Kd' and is therefore not identified in the hash table 30, the fourth input data would not result in a hash hit or a hash collision.

However, the control unit 20 will increment the value of the collision counter for a particular hash key upon determining a hash collision.

Referring again to FIG. 6, the control unit 20 now determines whether the input data is a cache hit (S130). If the input data is a cache hit, the compressing information is generated using the cache memory (S135).

For example, if the fourth input data (D0, D1, D2, D3) is received, data compression using the hash table 30 as described above will failed, and thus a determination must be made as to whether the data compression may be accomplished using the cache memory 50. Accordingly, the control unit 20 confirms whether the input data is previously stored in the cache memory 50. However, since in the working example the fourth input data (D0, D1, D2, D3) has not been previously stored in the cache memory 50, the fourth input data when received does not result in a cache hit (S130=N).

Accordingly, in this case, the control unit 20 is unable to perform data compression on the fourth input data using the cache memory 50.

Rather, the control unit 20 now determines whether the collision counter for the hash key is greater than or equal to a predetermined threshold value (S140). If the collision counter for the hash key is greater than or equal to the predetermined threshold value, the cache memory is updated (S145).

Again, as described above, it is now assumed that the fourth input data (D0, D1, D2, D3) is received and the collision counter for the hash key Ka becomes 3. Here, if it is assumed that the predetermined threshold value is 3, the collision counter for the hash key Ka becomes equal to the predetermined threshold value after being incremented as described above. Accordingly, the control unit 20 will update the cache memory 50 as described hereafter with reference to FIG. 8. Thus, any input data resulting in a hash collision when the collision counter equals or exceeds the threshold value will be stored in the cache memory 50. In this case, the data (A0, A1, A2, A3) indexed by 8 on the buffer memory 40 and the data (D0, D1, D2, D3) indexed by 48 on the buffer memory 40 are updated in the cache memory 50.

As a result of the foregoing, it is necessary to add "new data" to the cache memory 50. However, if the memory space available in the cache memory 50 is insufficient, data having the smallest reference counter value may be deleted, and the new data may be added thereto. This is because if the reference counter filed value is small, there is a low possibility of succeeding in the data compression processing using the data stored in the cache memory 50.

Referring back to FIG. 6, the control unit 20 will now determine whether the input data is the last data in a current input stream (S150). If the input data is not the last (S150=N), the hash table 30 is updated with the information related to the input data (S160). In the above-described example where the fourth input data (D0, D1, D2, D3) is received, it is not the last of the input stream (FIG. 4), and thus the update of the hash table 30 is performed. Specifically, as illustrated in FIG. 9, the collision counter for the hash key Ka is increased by 1, and the index for the hash key Ka is changed to 48.

Next, it is assumed that the first input data (A0, A1, A2, A3) is additionally indexed by the value '64' in the buffer memory 40 after being again received as the input data. The hash key generator 10 will again generate Ka as the hash key for the first input data (see FIG. 9). If the hash key is generated, the control unit 20 determines whether the input data is the hash hit by searching the hash table (FIG. 9) with the generated hash key Ka. However, since the index for the hash key Ka has been changed to 48, the indication data extracted from the buffer memory 40 (FIG. 4) becomes (D0, D1, D2, D3). Accordingly, in this case, the hash hit for the first input data (A0, A1, A2, A3) does not occur. On the other hand, since the hash collision has occurred in the same manner as described above, the collision counter for the hash key Ka becomes 4.

Next, the control unit 20 determines whether the first input data (A0, A1, A2, A3) is the cache hit by searching whether the first input data (A0, A1, A2, A3) has previously been stored in the cache memory 50 (FIG. 8). In this case, since the cache memory 50 (FIG. 8) is updated with the data related to the hash collision, the first input data (A0, A1, A2, A3) is present in the cache memory 50 (FIG. 8). That is, the control unit 20 is able to recognize that the index for the first input data (A0, A1, A2, A3) is 8 by searching the cache memory 50 (FIG. 8). Accordingly, the control unit 20 can generate the compressing information using the position information (for example, index 8) of the input data (A0, A1, A2, A3) and the length information searched from the cache memory (for example, 50 in FIG. 8).

On the other hand, since the collision counter for the hash key Ka becomes 4, this exceeds the predetermined threshold value (for example, 3). Accordingly, the control unit 20 updates the cache memory 50 as illustrated in FIG. 10. At this time, since the data (A0, A1, A2, A3) and (D0, D1, D2, D3) related to the hash collision have already been stored in the cache memory 50, only the reference counter of the input data (A0, A1, A2, A3) is increased as illustrated. Since the input data (A0, A1, A2, A3) is still not the last of the input stream, the hash table 30 is updated as shown in FIG. 11. Referring to FIG. 11, it can be known that the collision counter for the hash key Ka has been increased to 4 and the index field has been changed to 64.

As described above, according to the data compression apparatus and method according to the embodiment, both the hash table 30 and the cache memory 50 are used to compress the input data. If the data is compressed using both the hash table 30 and the cache memory 50, the following advantages can be achieved.

In a where data compression is performed using only the hash table 30, the data compression is not possible if the hash collision occurs as described above. That is, if data associated with a hash collision are alternately input as the input data, the data compression rate will be greatly lowered.

In order to prevent the above-described hash collision phenomenon, a method for changing the hash function that generates hash keys in a greater variety may be considered. However, the size of the hash table may well be restricted due to hardware limitations, and thus it is not easy to adopt such methods.

However, according to embodiments of the inventive concept like those described above, since the input data resulting in a hash collision are managed using a separate cache memory 50, a relatively high rate of data compression rate may be maintained, even when data resulting in hash collision(s) has been alternately input. That is, in the illustrated embodiments, relatively high data compression rates may be maintained using the hash table 30 as a dictionary for the data compression operation, storing the data in which the hash collision has occurred in the cache memory 50, and using the cache memory as a sub-dictionary. Further, in the illustrated embodiments, since the cache memory 50 is updated when the number of collisions becomes equal to or greater than a predetermined threshold value, unnecessary write operations need not be made to store input data in the cache memory 50.

Next, referring to FIGS. 1, 12A and 12B, a data compression method according to another embodiment of the inventive concept will be described.

Figure 12A:
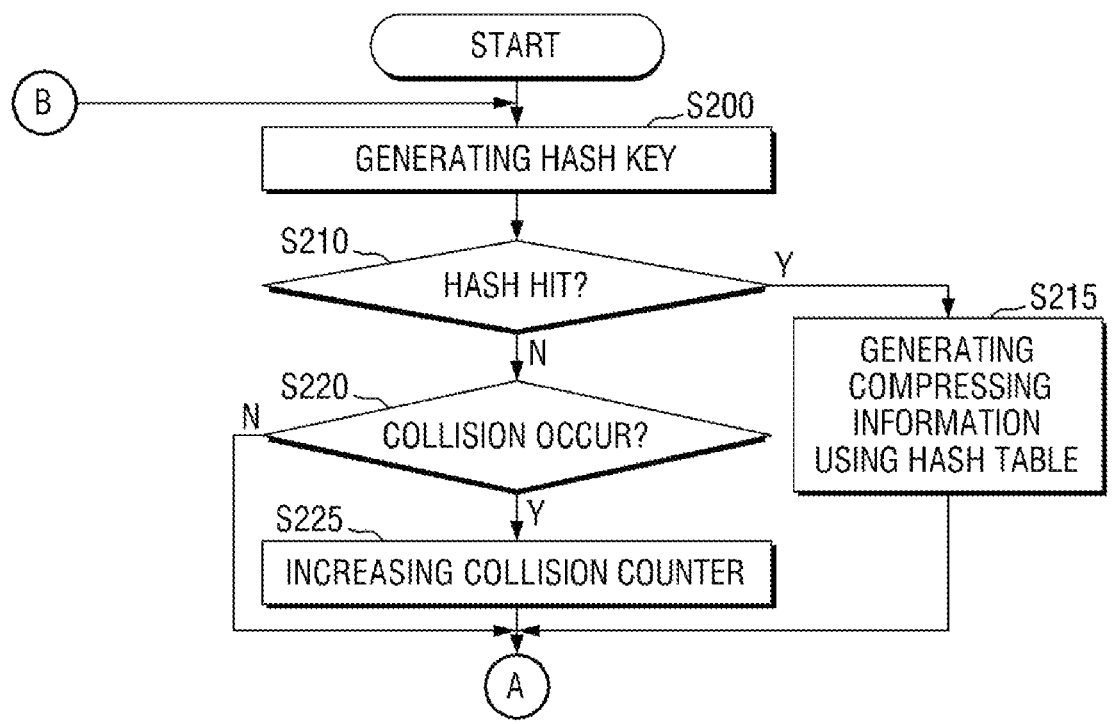
FIG. 12A and 12B are related flowcharts summarizing a data compression method according to certain embodiments of the inventive concept.
Figure 12B:
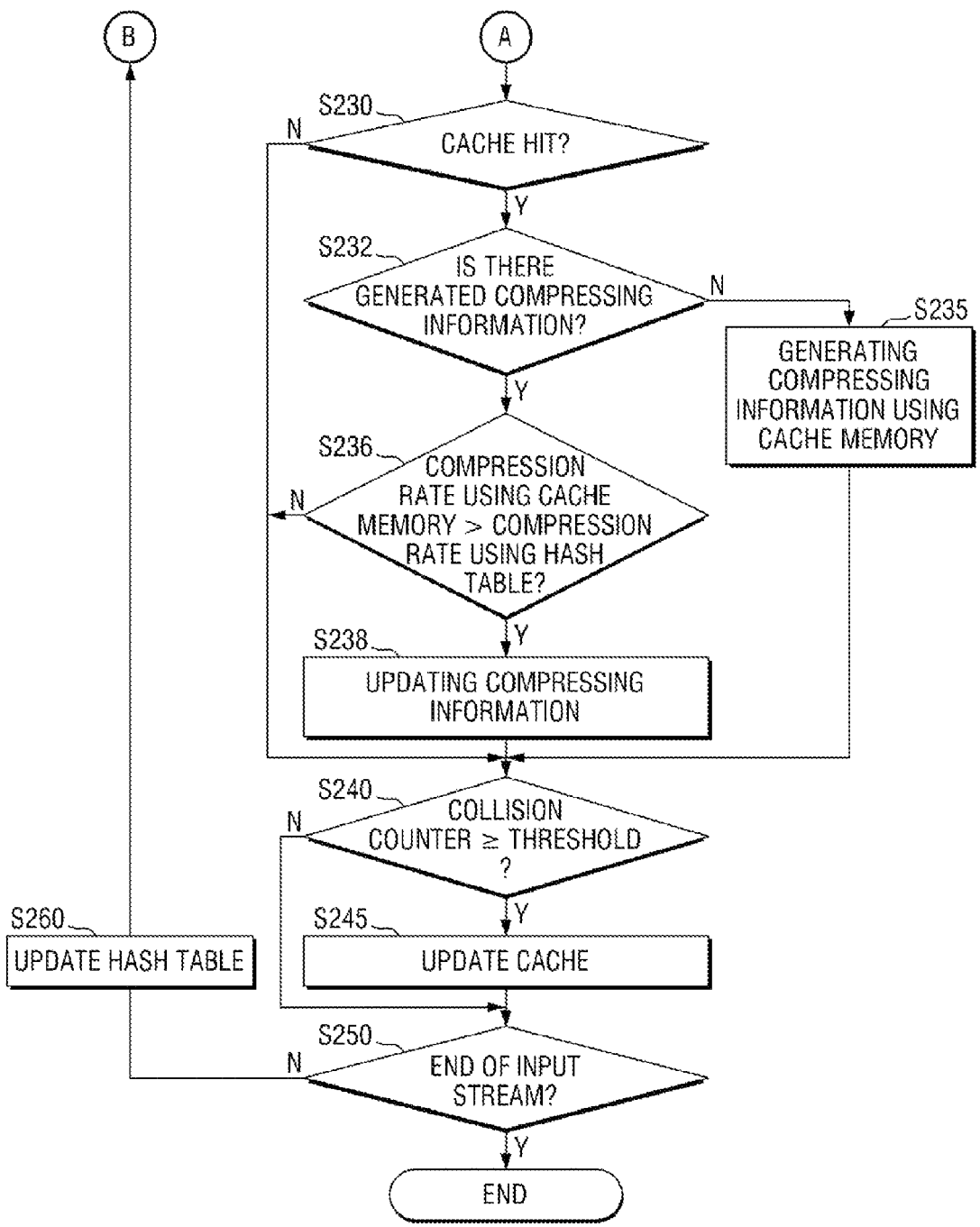

FIG. 12A and 12B are related flowcharts summarizing a data compression method according to another embodiment of the inventive concept. Hereinafter, explanations of the matters previously described will be omitted for brevity.

First, referring to FIG. 12A, a hash key for the input data is generated (S200). Then, it is determined whether the input data is the hash hit based on the generated hash key (S210). If the input data is the hash hot as the result of the determination, compressing information is generated using the hash table (S215). If the input data is not the hash hot, it is determined whether the hash collision has occurred (S220). If the hash collision has occurred as the result of the determination, the collision counter of the hash table is increased (S225). Since these operations are not greatly different from the above-described embodiment, the explanation of the detailed operations will be omitted.

Next, referring to FIG. 12B, it is determined whether the input data is the cache hit (S230). If the input data is the cache hit, it is confirmed whether already generated compressing information is present with respect to the input data (S232). If the already generated compressing information is not present as the result of the confirmation, the compressing information is generated using the cache memory (S235).

If no hash collision occurs with respect to the input data and the compression using the hash table 30 is possible in the above-described steps, the already generated compressing information may be present. However, if the cache hit has occurred, but the already generated compressing information is not present, it means that such input data can be compressed using the cache memory 50. Accordingly, if the cache hit has occurred, but the already generated compressing information is not present, the control unit 20 generates the compressing information using the cache memory 50.

Referring again to FIG. 12B, if the input data is the cache hit and the already generated compressing information is present with respect to the input data, it is confirmed whether the compression rate when the input data is compressed using the cache memory is higher than the compression rate when the input data is compressed using the hash table (S236). If the compression rate when the input data is compressed using the cache memory is higher than the compression rate when the input data is compressed using the hash table, the compressing information is updated (S238). That is, the existing compressing information generated using the hash table is updated with the compressing information generated suing the cache memory.

In the process of compressing the data, the input data may be both the hash hit and the cache hit. In this case, the control unit 20 may compare the compression rates for both cases, and compress the input data using the method that results in the higher compression rate.

Referring again to FIG. 12B, it is determined whether the collision counter for the hash key is equal to or larger than the predetermined threshold value (S240). Then, if the collision counter for the hash key is equal to or larger than the predetermined threshold value, the cache memory is updated (S245). Then, it is determined whether the input data is the last of the input stream (S250). If the input data is not the last as the result of the determination, the hash table is updated (S260). Since these operations are not greatly different from the above-described embodiment, a detailed explanation will be omitted.

As described above, the control unit 20 may first determine whether the input data is the hash hit, and then determine whether the input data is the cache hit. However, embodiments of the inventive concept are not limited to this particular order of steps. In other embodiments of the inventive concept, the control unit 20 may first determine whether the input data is the cache hit, and then determine whether the input data is the hash hit.

On the other hand, the data compression operations according to certain embodiments of the inventive concept may be performed on-the-fly.

Figure 13:
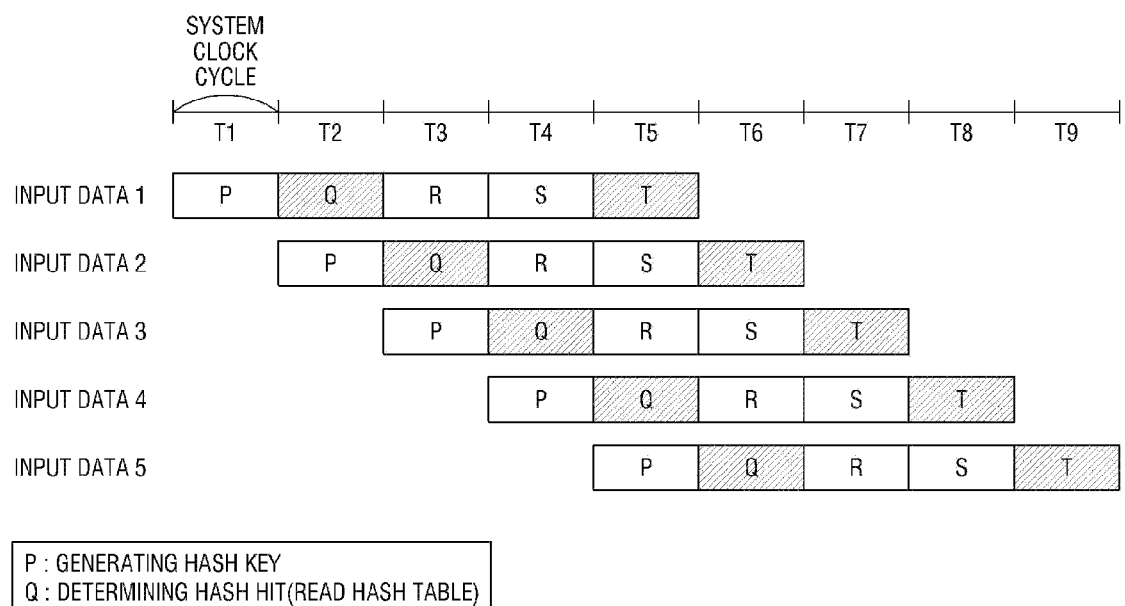
FIG. 13 is an operating diagram further illustrating certain timing considerations that may exist in relation to data compression methods consistent with embodiments of the inventive concept.

FIG. 13 is an operating diagram illustrating certain timing considerations for the data compression methods according to certain embodiments of the inventive concept.

Referring to FIG. 13, data compression operations as described above may be simultaneously performed during one system clock cycle. Specifically, during the first system clock cycle T1, a hash key generation operation P for the first input data INPUT DATA 1 may be performed.

Then, during the second system clock cycle T2, a hash key generation operation P for the second input data INPUT DATA 2 and a hash hit determination operation Q for the first input data INPUT DATA 1 may be simultaneously performed.

Then, during the third system clock cycle T3, a hash key generation operation P for the third input data INPUT DATA 3, a hash hit determination operation Q for the second input data INPUT DATA 2, and a cache hit determination operation R for the first input data INPUT DATA 1 may be simultaneously performed.

Then, during the fourth system clock cycle T4, a hash key generation operation P for the fourth input data INPUT DATA 4, a hash hit determination operation Q for the third input data INPUT DATA 3, a cache hit determination operation R for the second input data INPUT DATA 2, and an operation S of encoding the first input data INPUT DATA 1 with the compressing information may be simultaneously performed.

Then, during the fifth system clock cycle T5, a hash key generation operation P for the fifth input data INPUT DATA 5, a hash hit determination operation Q for the fourth input data INPUT DATA 4, a cache hit determination operation R for the third input data INPUT DATA 3, an operation S of encoding the second input data INPUT DATA 2 with the compressing information, and an operation T of updating the hash table using the compressing information for the first input data INPUT DATA 1 may be simultaneously performed.

In data compression methods consistent with certain embodiments of the inventive concept, in order to improve the data compression efficiency, the above-described data compression operations may be performed in parallel using an on-the-fly method. On the other hand, the respective operations P to T necessary to the data compression exemplified therein are merely exemplary, and the respective operations performed in parallel by other embodiments are not limited to operations P to T.

Referring again to FIG. 13, in order to perform the data compression operation, during certain system clock cycles (for example, T5 and T6), the hash table 30 must be able to be is simultaneously read from and written to. Specifically, during the fifth system clock cycle T5, the hash table 30 should be updated (i.e., written to) with the compressing information for the first input data INPUT DATA 1, but should also be simultaneously read from to determine the hash hit for the fourth input data INPUT DATA 4. Accordingly, the data compression apparatus according to the embodiments of the inventive concept may be designed with a structure that can support such parallel execution of different operations.

For example, the hash table 30 of the data compression apparatus 1 as illustrated in FIG. 1 may be implemented by a DP-SRAM (Dual Port SRAM) so that the hash table may be simultaneously read from and/or written to during a single system clock cycle. However, the inventive concept is not limited thereto, and implementation methods for the data compression apparatus may be variously modified.

Figure 14:
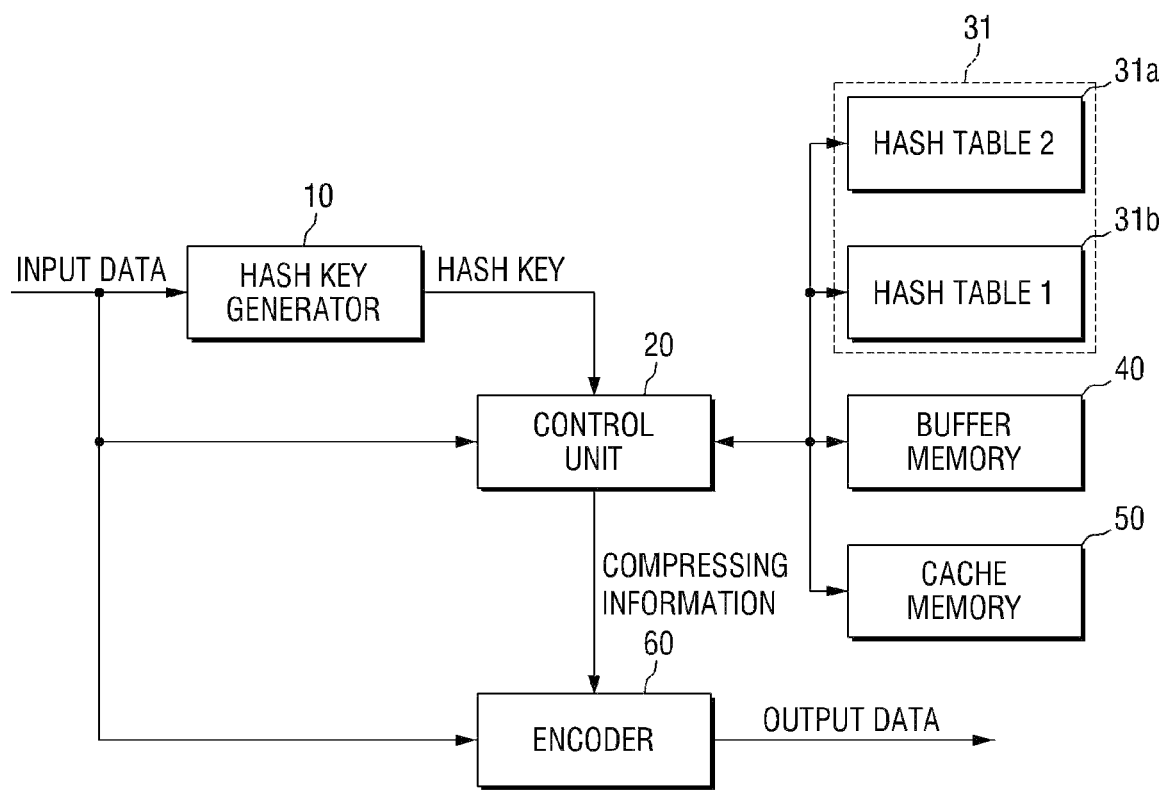
FIG. 14 is a block diagram illustrating a data compression apparatus according to certain embodiments of the inventive concept.

FIG. 14 is a block diagram of a data compression apparatus according to certain embodiment of the inventive concept. The data compression apparatus 2 of FIG. 14 is essentially the same as the data compression apparatus 1 of FIG. 1, except for the provision and operative nature of hash table 31.

Referring to FIG. 14, the hash table 31 may be implemented by partitioning a first hash table 31a from a second hash table 31b. Here, the first hash table 31a and the second hash table 31b may be implemented using (e.g.,) a SP-SRAM (Single Port SRAM). In the case where the hash table 31 is implemented by the SP-SRAM, the area occupied by the hash table 31 in the data compression apparatus 2 is relatively reduced, and thus the data compression apparatus 2 can be miniaturized. Further, the data compression apparatus 2 can be operated with a high-frequency system clock, and thus the data compression speed can be improved.

The first hash table 31a and the second hash table 31b may alternately perform different operations during a single system clock cycle. This will be described in some additional detail with reference to the example of FIG. 13. During the fifth system clock cycle T5, the first hash table 31a may be updated (that is, written) with the compressing information for the first input data INPUT DATA 1, and the second hash table 31b may be read to determine the hash hit with respect to the fourth input data INPUT DATA 4.

Further, during the sixth system clock cycle T6, the second hash table 31b may be updated (that is, written) with the compressing information for the second input data INPUT DATA 2, and the first hash table 31a may be read to determine the hash hit with respect to the fifth input data INPUT DATA 5.

That is, in the first hash table 31a, read and write operations of odd-numbered input data INPUT DATA 1, 3, and 5 are performed, and in the second hash table 31b, read and write operations of even-numbered input data INPUT DATA 2 and 4 are performed. However, since the read operation for the first hash table 31a and the write operation for the second hash table 31b are simultaneously performed during a system clock cycle, the data compression apparatus 2 according to certain embodiments of the inventive concept may smoothly perform data compression operations in parallel as illustrated in FIG. 13.

Referring now to FIGS. 15, 16, 17 and 18, a memory system and various application examples thereof according to embodiments of the inventive concept will be described.

Figure 15:
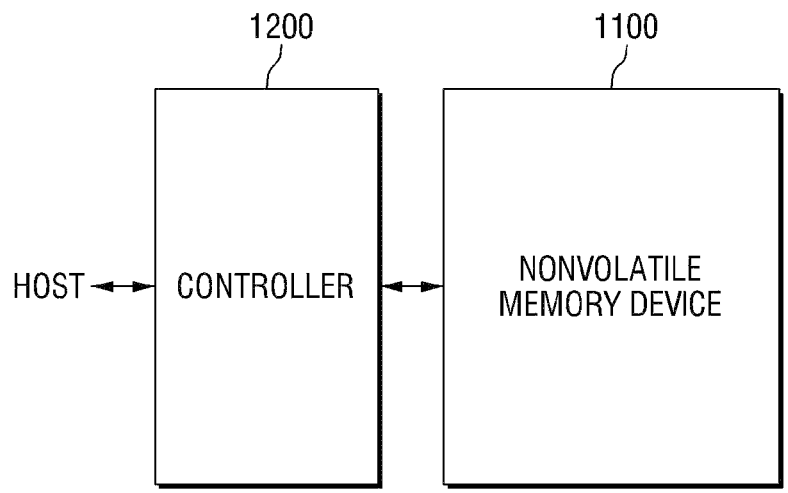
FIG. 15 is a general block diagram illustrating a memory system according to certain embodiments of the inventive concept.
Figure 16:
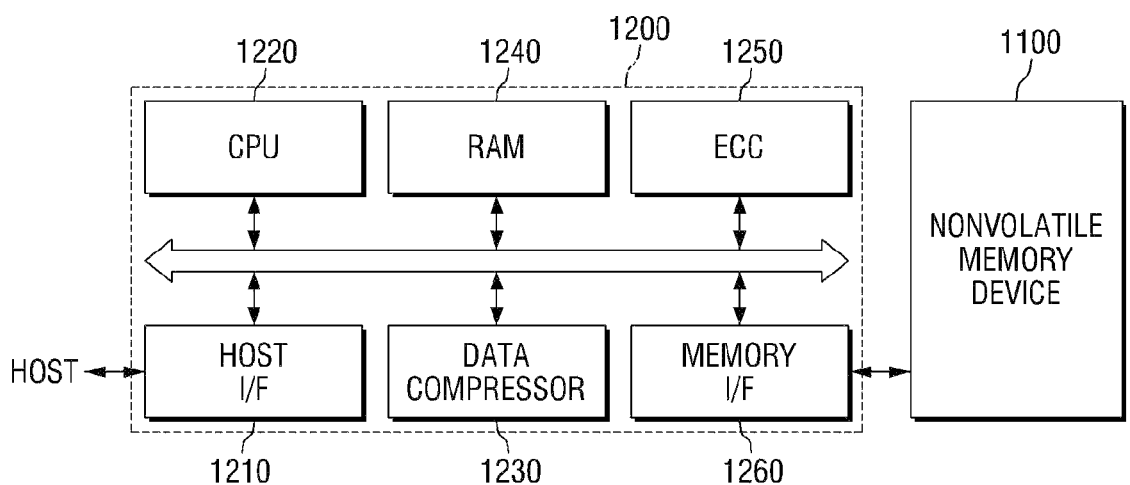
FIG. 16 is a block diagram further illustrating the controller 1000 of FIG. 15.
Figure 17:
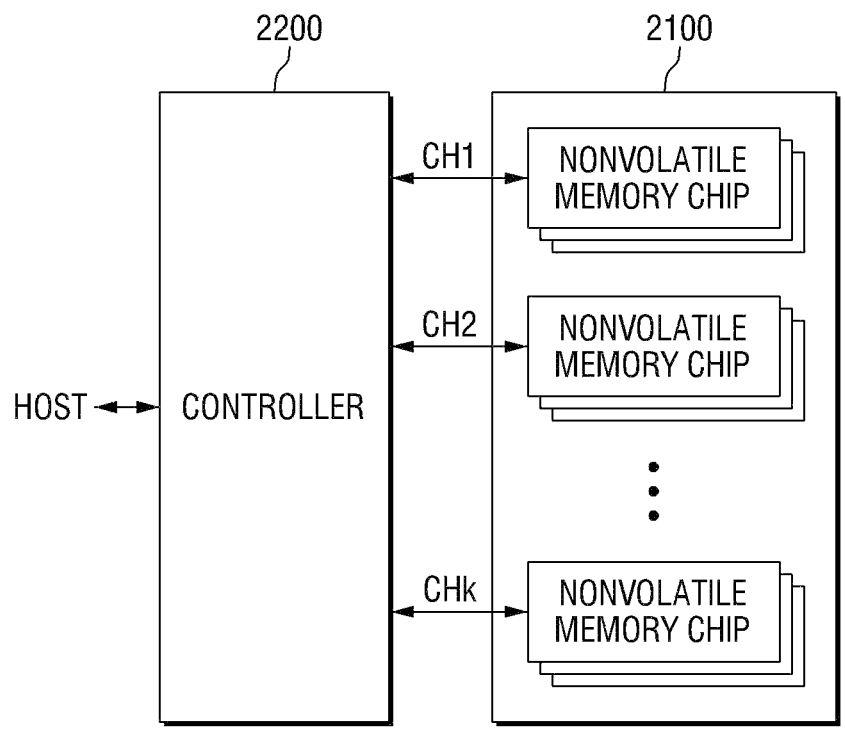
FIGS. 17 and 18 are respective block diagrams illustrating certain applications that may include a memory system according to embodiments of the inventive concept.
Figure 18:
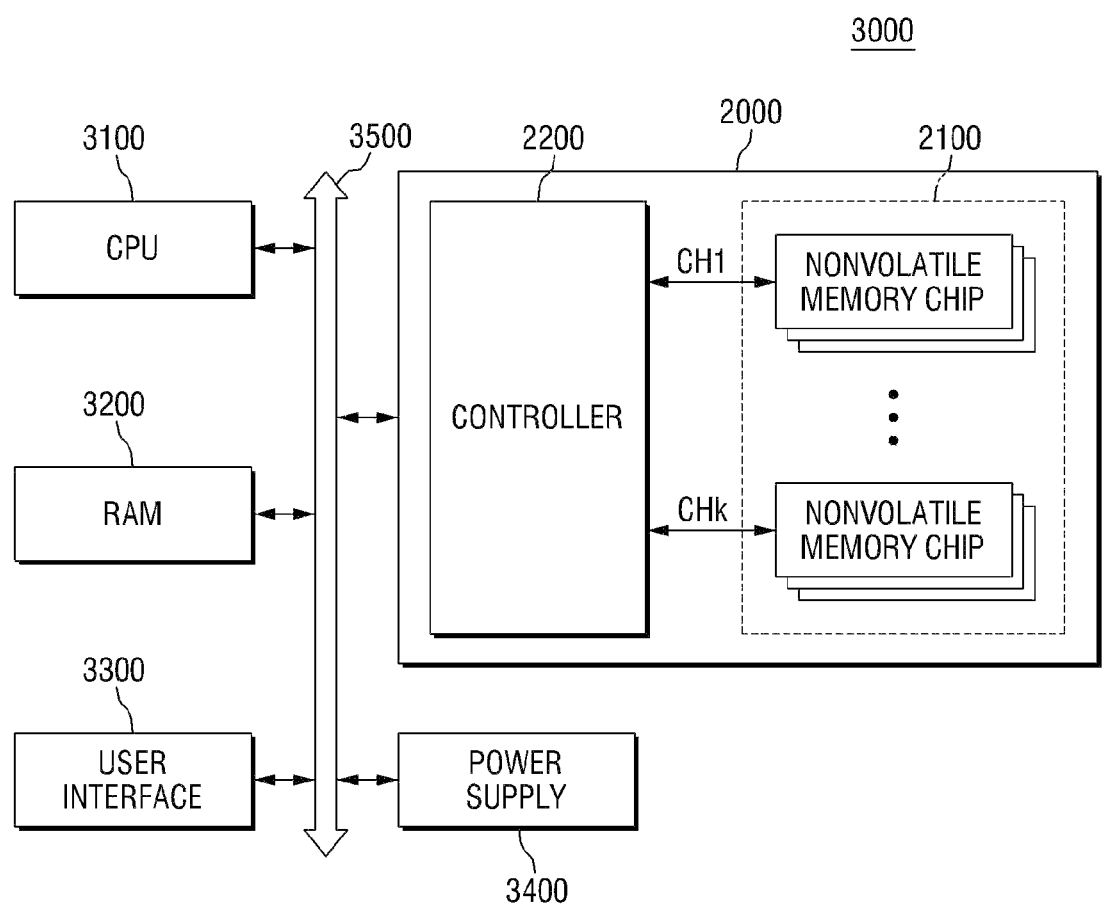

FIG. 15 is a general block diagram illustrating a memory system according to embodiments of the inventive concept. FIG. 16 is a block diagram further illustrating the controller 1000 of FIG. 15. FIG. 17 is a block diagram illustrating one possible application example for the memory system of FIG. 15, and FIG. 18 is a block diagram illustrating a computing system including the memory system of FIG. 17.

Referring to FIG. 15, a memory system 1000 includes a nonvolatile memory 1100 and a controller 1200.

The nonvolatile memory device 1100 may be, for example, a flash memory device including NAND or NOR. However, the present inventive concept is not limited to such examples, and in some embodiments of the present inventive concept, the nonvolatile memory device 110 may be any one of a PRAM (Phase-change RAM), a FRAM (Ferroelectric RAM), and a RRAM (Resistive RAM).

The controller 1200 is connected to a host and the nonvolatile memory device 1100. The controller 1200 may be configured to access the nonvolatile memory device 1100 in response to a request from the host. For example, the controller 1200 may be configured to control read, write, erase, and background operations of the nonvolatile memory device 1100. Particularly, in the embodiment, the controller 1200 may receive the input data from the host and output the output data obtained by compressing the input data.

On the other hand, the controller 1200 may be configured to provide an interface between the nonvolatile memory device 1100 and the host. Further, the controller 1200 may be configured to drive firmware to control the nonvolatile memory device 1100. Exemplarily, the controller 1200 may further include well known constituent elements, such as a RAM (Random Access Memory), a central processing unit, a host interface, and a memory interface.

Hereinafter, referring to FIG. 16, the configuration of the controller 1200 in some embodiments of the present inventive concept will be described in more detail.

Referring to FIG. 16, the controller 1200 may include a host interface 1210, a RAM 1240, a data compression apparatus 1230, an ECC, a memory interface 1260, and a central processing unit 1220.

The host outputs operation commands (for example, read command, write command, erase command, and the like), addresses, and data to the host interface 1210. The host interface 1210 includes a protocol to perform data exchange between the host and the controller 1200.

Exemplarily, the host interface 1210 may include at least one of various protocols, such as a USB (Universal Serial Bus) protocol, a MMC (Multimedia Card) protocol, a PCI (Peripheral Component Interconnection) protocol, a PCI-E (PCI-Express) protocol, an ATA (Advanced Technology Attachment) protocol, a Serial-ATA protocol, an ESDI (Enhanced Small Disk Interface) protocol, and an IDE (Integrated Drive Electronics) protocol.

The RAM 1240 is used as an operating memory of the central processing unit 1220, and may be implemented by a DRAM or a SRAM. In some embodiments of the present inventive concept, the RAM 1240 may be used as the buffer memory (40 in FIG. 1) as described above, and may temporarily store the data output from the host.

The data compression apparatus 1230 may compress the input data input from the host and provide the compressed data to the nonvolatile memory device 1100 or bypass the input data input from the host to the nonvolatile memory device 1100. In the embodiment, the data compression apparatuses 1 and 2 according to the embodiments of the present inventive concept may be adopted as the compression apparatus 1230.

The ECC 1250 detects and corrects defects that are included in the data read from the nonvolatile memory device 1100 or the data written in the nonvolatile memory device 1100. The ECC 1250 may be configured to detect and correct an error of the data read from the nonvolatile memory device 1100 using an error correction code. FIG. 16 illustrates that the ECC 1250 is provided as a constituent element of the controller 1200, but the present inventive concept is not limited thereto. In some embodiments of the present inventive concept, the ECC 1250 may be provided as a constituent element of the nonvolatile memory device 1100.

The memory interface 1260 interfaces with the nonvolatile memory device 1100. For example, the memory interface 1260 may include a NAND interface or a NOR interface.

The central processing unit 1220 may perform general control operation for data exchange of the controller 1200. Although not illustrated in the drawing, in some embodiments of the present inventive concept, it is apparent to those of ordinary skill in the art that the memory system 1000 may further include a ROM (not illustrated) in which code data for interfacing with the host is stored.

Referring again to FIG. 15, the controller 1200 and the nonvolatile memory device 1100 may be integrated into one semiconductor device. For example, the controller 1200 and the nonvolatile memory device may be integrated into one semiconductor device to configure a memory card, such as a PC card (PCMCIA (Personal Computer Memory Card International Association)), a compact flash (CF) card, a smart media card (SM or SMC), a memory stick, a multimedia card (MMC, RS-MMC, MMCmicro), a SD card (SD, miniSD, microSD, or SDHC), a universal flash storage device (UFS), or the like.

In some embodiments of the present inventive concept, the controller 1200 and the nonvolatile memory device 1100 may be integrated into one semiconductor device to configure a SSD (Solid State Drive). The SSD includes a storage device that is configured to store data in a semiconductor memory. In the case where the memory system 1000 is used as the SSD, the operating speed of the host that is connected to the memory system 1000 can be remarkably improved.

As another example, the memory system 1000 may be provided as one of various constituent elements of electronic devices, such as a computer, a UMPC (Ultra Mobile PC), a work station, a net-book, a PDA (Personal Digital Assistants), a portable computer, a web tablet, a wireless phone, a mobile phone, a smart phone, an e-book, a PMP (Portable Multimedia Player), a portable game machine, a navigation device, a black box, a digital camera, a 3-dimensional television receiver, a digital audio recorder, a digital audio player, a digital picture recorder, a digital picture player, a digital video recorder, a digital video player, a device that can transmit and receive information in a wireless environment, one of various electronic devices constituting a home network, one of various electronic devices constituting a computer network, one of various electronic devices constituting a telematics network, an RFID device, or one of various constituent elements constituting a computing system.

Exemplarily, the nonvolatile memory device 1100 or the memory system 1000 may be mounted as various types of packages. For example, the nonvolatile memory device 1100 or the memory system 1000 may be packaged and mounted as PoP(Package on Package), Ball grid arrays(BGAs), Chip scale packages(CSPs), Plastic Leaded Chip Carrier(PLCC), Plastic Dual In Line Package(PDIP), Die in Waffle Pack, Die in Wafer Form, Chip On Board(COB), Ceramic Dual In Line Package(CERDIP), Plastic Metric Quad Flat Pack(MQFP), Thin Quad Flatpack(TQFP), Small Outline(SOIC), Shrink Small Outline Package(SSOP), Thin Small Outline(TSOP), Thin Quad Flatpack(TQFP), System In Package(SIP), Multi Chip Package(MCP), Wafer-level Fabricated Package(WFP), Wafer-Level Processed Stack Package(WSP), or the like.

Next, referring to FIG. 17, a memory system 2000 includes a non-volatile memory device 2100 and a controller 2200. The nonvolatile memory device 2100 includes a plurality of nonvolatile memory chips. The plurality of memory chips are divided into a plurality of groups. The respective groups of the plurality of nonvolatile memory chips are configured to communicate with the controller 2200 through one common channel. For example, it is illustrated that the plurality of nonvolatile memory chips communicate with the controller 2200 through first to k-th channels CH1 to CHk.

In FIG. 17, it is described that the plurality of nonvolatile memory chips are connected to one channel. However, it could be understood that the memory system 2000 can be modified so that one nonvolatile memory chip is connected to one channel.

Next, referring to FIG. 18, a computing system 3000 includes a central processing unit 3100, a RAM (Random Access Memory) 3200, a user interface 3300, a power supply 3400, and a memory system 2000.

The memory system 2000 is electrically connected to the central processing unit 3100, the RAM 3200, the user interface 3300, and the power supply 3400 through a system bus 3500. Data which is provided through the user interface 3300 is processed by the central processing unit 3100 is stored in the memory system 2000.

FIG. 18 illustrates that the nonvolatile memory device 2100 is connected to the system bus 3500 through the controller 2200. However, the nonvolatile memory device 210 may be configured to be directly connected to the system bus 3500.

FIG. 18 illustrates that the memory system 2000 described with reference to FIG. 17 is provided. However, the memory system 2000 may be replaced by the memory system 1000 described with reference to FIG. 17.

Exemplarily, the computing system 3000 may be configured to include all the memory systems 1000 and 2000 described with reference to FIGS. 15 and 17.

Figure 19:
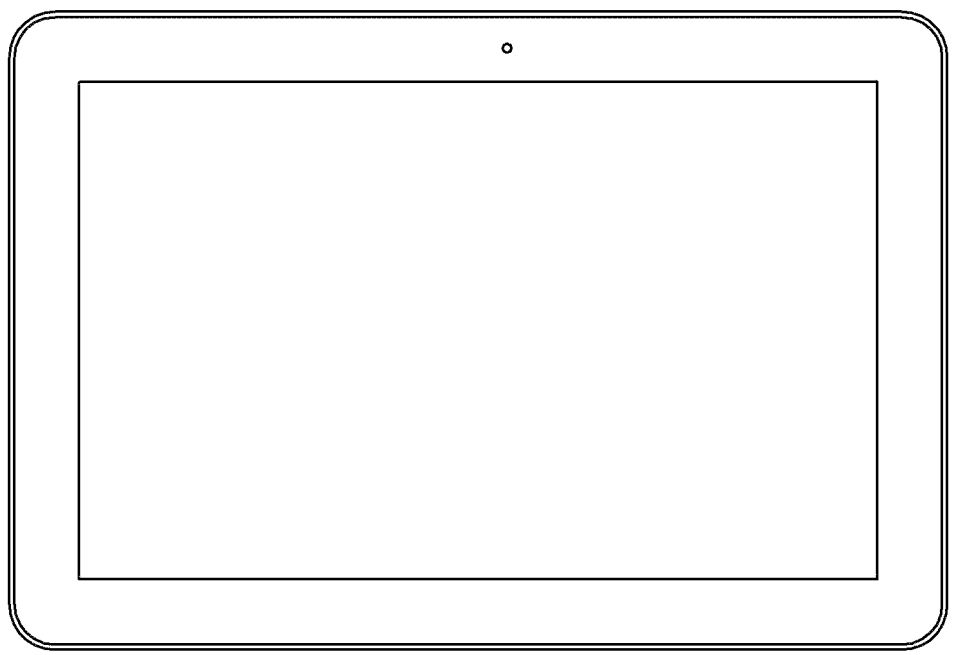
FIGS. 19 and 20 are respective views illustrating certain electronic devices that may incorporate a memory system according to embodiments of the inventive concept.
Figure 20:
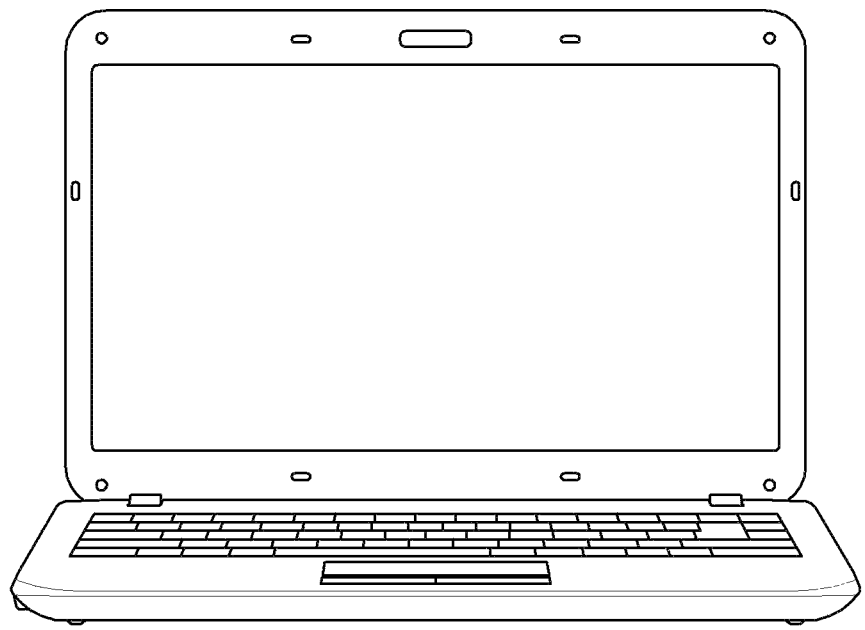

FIGS. 19 and 20 are views illustrating exemplary electronic devices to which the memory system and the computing system according to some embodiments of the present inventive concept can be applied.

FIG. 19 illustrates a tablet PC, and FIG. 20 illustrates a notebook computer. At least one of the memory systems 1000 and 2000 and the computing system 3000 according to the embodiments of the present inventive concept may be used in the tablet PC or the notebook computer. It is apparent to those skilled in the art that the memory systems 1000 and 2000 and the computing system 3000 according to some embodiments of the present inventive concept can be applied to other non-exemplary electronic devices.

Although preferred embodiments of the present inventive concept have been described for illustrative purposes, those skilled in the art will appreciate that various modifications, additions and substitutions are possible, without departing from the scope of the inventive concept as disclosed in the accompanying claims.

What is claimed is:

1. A data compression method comprising:
   receiving input data and generating a hash key for the input data;
   searching a hash table having a first index pointing to a location of data corresponding to the input data in a buffer memory with the hash key, and upon determining that the input data is a hash hit, compressing the input data using the first index of the hash table; else
   searching a cache memory having a second index pointing to a location of data corresponding to the input data in the buffer memory with the input data, and upon determining that the input data is a cache hit, compressing the input data using the second index of the cache memory.

2. The data compression method of claim 1, wherein the determining whether the input data is a hash hit comprises:
   extracting the first index for the input data from the hash table using the hash key;
   extracting indication data identified by the first index from data stored in the buffer memory; and
   determining that the input data is the hash hit when the input data is equal to the indication data.

3. The data compression method of claim 2, wherein the compressing the input data using the hash table comprises:
   compressing the input data using the first index and length information for the indication data.

4. The data compression method of claim 1, wherein the determining whether the input data is a cache hit comprises:
   determining whether the input data has previously been stored in the cache memory.

5. The data compression method of claim 4, wherein the compressing the input data using the cache memory comprises:
   compressing the input data using the second index for the input data extracted from the cache memory and length information for the input data stored in the cache memory.

6. The data compression method of claim 1, further comprising:
   determining whether a hash collision occurs after determining that the input data is not the hash hit;
   incrementing a collision counter for the hash key upon determining that the hash collision occurs; and
   updating the cache memory if the collision counter for the hash key is equal to or greater than a threshold value.

7. The data compression method of claim 6, further comprising:
   updating the hash table after updating the cache memory.

8. The data compression method of claim 1, wherein the determining whether the input data is the cache hit is performed after determining whether the input data is the hash hit.

9. The data compression method of claim 8, further comprising:
   upon determining that the input data is the hash hit or the cache hit, comparing a first compression rate when the input data is compressed using the hash table with a second compression rate when the input data is compressed using the cache memory to determine a higher compression rate, and thereafter selecting one of the first and second compression rates corresponding to the higher compression rate to compress the input data.

10. The data compression method of claim 1, further comprising:
    providing output data generated by compressing the input data to a nonvolatile memory device.

11. A data compression method comprising:
    determining whether first input data is a hash hit by searching a hash table using a hash key generated for the first input data; and
    determining whether second input data, different from the first input data, is a cache hit by searching a cache memory using the second input data,
    wherein determining whether the first input data is the hash hit and determining whether the second input data is the cache hit are simultaneously performed during a first system clock cycle.

12. The data compression method of claim 11, further comprising:
    updating the hash table based on a result of compressing third input data, different from the second input data,
    wherein determining whether the first input data is the hash hit and updating the hash table are simultaneously performed during the first system clock cycle.

13. The data compression method of claim 12, further comprising:
    generating a hash key for fourth input data, different from the third input data; and
    encoding fifth input data, different from the fourth input data, based on a result of compressing the fifth input data,
    wherein determining whether the first input data is the hash hit, generating the hash key for the fourth input data, and encoding the fifth input data are simultaneously performed during the first system clock cycle.

14. The data compression method of claim 13, further comprising:
    after generating the hash key for the fourth input data, determining whether the fourth input data is a hash hit by searching the hash table using the hash key generated for the fourth input data during a second system clock cycle; and
    determining whether the fourth input data is a cache hit by searching the cache memory with the fourth input data during a third system clock cycle.

15. The data compression method of claim 14, wherein the third system clock cycle follows the second system clock cycle.

16. A data compression apparatus comprising:
    a hash key generator configured to receive input data and provide a corresponding hash key;
    a control unit configured to determine whether the input data is a hash hit by searching a hash table using the hash key or after determining that the input data is not a hash hit to determine whether the input data is a cache hit by searching a cache memory using the input data, and to provide compressing information corresponding to the input data; and
    an encoder configured to encode the input data based on the compressing information and provide output data obtained by compressing the input data.

17. The data compression apparatus of claim 16, wherein the hash table includes a first hash table and a second hash table, and
    the control unit is further configured to determine whether the input data is the hash hit in the first hash table during a first system clock cycle, and determine whether the input data is the hash hit in the second hash table during a second system clock cycle.

18. The data compression apparatus of claim 17, wherein the first hash table and the second hash table are implemented using a SP-SRAM (Singly Port Static Random Access Memory).

19. The data compression apparatus of claim 16, wherein the hash table is implemented using a DP-SRAM (Dual Port SRAM).

20. The data compression apparatus of claim 16, wherein the hash table includes a collision counter field recording a number of hash collisions.

21. The data compression apparatus of claim 16, wherein the cache memory is implemented using a plurality of flip-flops.

22. The data compression apparatus of claim 16, further comprising:
    a buffer memory implemented by the hash table and a Static Random Access Memory (SRAM) indexed by the cache memory.

23. The data compression apparatus of claim 16, wherein the output data includes position information and length information for the input data.

24. A memory system comprising:
    a controller configured to receive input data from a host and provide output data obtained by compressing the input data; and
    a nonvolatile memory device that stores the output data,
    wherein the controller includes a data compression apparatus including a hash table used to generate the output data, and a cache memory, and
    the data compression apparatus is configured to search the hash table using a hash key generated for the input data, and upon determining that the input data is a hash hit, the data compression apparatus is further configured to generate the output data using the hash table, else to search the cache memory using the input data and upon determining that the input data is a cache hit to generate the output data using the cache memory.

25. The memory system of claim 24, further comprising:
    a buffer memory indexed by the cache memory and the hash table.

26. The memory system of claim 24, wherein the nonvolatile memory device comprises a plurality of nonvolatile memory chips being divided into a plurality of groups, each group respectively communicating with the controller via a common channel.

* * * * *